United States Patent
Cooper, Jr.

(10) Patent No.: US 9,780,206 B2
(45) Date of Patent: Oct. 3, 2017

(54) METHODS OF REDUCING THE ELECTRICAL AND THERMAL RESISTANCE OF SIC SUBSTRATES AND DEVICES MADE THEREBY

(71) Applicant: Purdue Research Foundation, West Lafayette, IN (US)

(72) Inventor: James Albert Cooper, Jr., Santa Fe, NM (US)

(73) Assignees: Purdue Research Foundation, West Lafayette, IN (US); Global Power Technologies Group, Inc., Lake Forest, CA (US)

( * ) Notice: Subject to any disclaimer, the term of this patent is extended or adjusted under 35 U.S.C. 154(b) by 0 days.

(21) Appl. No.: 15/057,055

(22) Filed: Feb. 29, 2016

(65) Prior Publication Data

US 2017/0025530 A1    Jan. 26, 2017

Related U.S. Application Data

(60) Provisional application No. 62/121,916, filed on Feb. 27, 2015.

(51) Int. Cl.
| | |
|---|---|
| *H01L 29/15* | (2006.01) |
| *H01L 29/78* | (2006.01) |
| *H01L 29/16* | (2006.01) |
| *H01L 29/739* | (2006.01) |
| *H01L 29/872* | (2006.01) |
| *H01L 21/04* | (2006.01) |
| *H01L 29/10* | (2006.01) |

(52) U.S. Cl.
CPC ...... *H01L 29/7816* (2013.01); *H01L 21/0475* (2013.01); *H01L 29/1079* (2013.01); *H01L 29/1608* (2013.01); *H01L 29/7393* (2013.01); *H01L 29/872* (2013.01)

(58) Field of Classification Search
CPC ............. H01L 29/7816; H01L 21/0475; H01L 29/1079; H01L 29/1608; H01L 29/7393; H01L 29/872
USPC ......................................................... 257/77
See application file for complete search history.

(56) References Cited

U.S. PATENT DOCUMENTS

| | | | | |
|---|---|---|---|---|
| 2004/0082116 A1* | 4/2004 | Kub | ................... | H01L 29/0657 438/137 |
| 2005/0156283 A1* | 7/2005 | Tokuda | ............... | H01L 29/0657 257/622 |
| 2006/0192256 A1* | 8/2006 | Cooper | ............... | H01L 29/0696 257/401 |
| 2007/0117254 A1* | 5/2007 | Pain | .................. | H01L 27/14621 438/75 |

(Continued)

OTHER PUBLICATIONS

Saha, Asmita and Cooper, James A., "A 1-kV 4H-SiC power DMOSFET optimized for low ON-resistance" (2007). Birck and NCN Publications. Paper 234. http://docs.lib.purdue.edu/nanopub/234.

*Primary Examiner* — Evan Pert
*Assistant Examiner* — Herve Assouman
(74) *Attorney, Agent, or Firm* — Maginot, Moore & Beck LLP

(57) ABSTRACT

A power semiconductor device includes a silicon carbide substrate and at least a first layer or region formed above the substrate. The silicon carbide substrate has a pattern of pits formed thereon. The device further comprising an ohmic metal disposed at least in the pits to form low-resistance ohmic contacts.

9 Claims, 6 Drawing Sheets

(56) References Cited

U.S. PATENT DOCUMENTS

| | | | | |
|---|---|---|---|---|
| 2008/0296771 A1* | 12/2008 | Das | ................... | H01L 21/0475 257/758 |
| 2012/0211768 A1* | 8/2012 | Yoshikawa | ......... | H01L 29/0653 257/77 |
| 2012/0273802 A1* | 11/2012 | Zhang | ................ | H01L 29/0615 257/77 |
| 2013/0313570 A1* | 11/2013 | Sdrulla | ............... | H01L 29/7806 257/77 |

* cited by examiner

METHODS OF REDUCING THE ELECTRICAL AND THERMAL RESISTANCE OF SIC SUBSTRATES AND DEVICES MADE THEREBY

This application claims the benefit of U.S. Provisional Patent Application Ser. No. 62/121,916, filed Feb. 27, 2015, the entirety of which is incorporated herein by reference.

BACKGROUND OF THE INVENTION

The present invention generally relates to semiconductor devices. More particularly, this invention relates to silicon carbide (SiC) semiconductor power switching devices and methods of making the same.

Silicon carbide (SiC) semiconductor power switching devices such as Schottky diodes and MOS transistors (MOSFETs) are in commercial production at various companies around the world, and are increasingly making their way into systems. Accordingly, there is an ongoing desire for methods by which the performance of these devices may be improved and their cost of manufacture reduced.

SUMMARY

Embodiments of the present invention provide an improvement to the art by providing a design of a silicon carbide power semiconductor device that employs a pattern of pits and ohmic contacts within the pits to reduce the specific on-resistance (or resistance-area product) of the device.

A first embodiment is a power semiconductor device that includes a silicon carbide substrate and a least a first region or layer formed thereon. The silicon carbide substrate has a pattern of pits formed thereon. The device further includes an ohmic metal disposed at least in the pits to form low-resistance ohmic contacts.

Examples of the first embodiment may include Schottky diodes, D-MOSFETs, and IGBTs.

Another embodiment is a method of forming at least a part of a power semiconductor device that includes at least a first layer formed above a first side of silicon carbide substrate. The method also includes forming a pattern of pits on a second side of the silicon carbide substrate. The method also includes locating an ohmic metal at least within the pits to define low-resistance ohmic contacts.

The presence of the pattern of pits and ohmic contacts provides a reduced on resistance which improves the device operation. Such features and advantages, as well as others, will become readily apparent to those of ordinary skill in the art by reference to the following detailed description and accompanying drawings.

DETAILED DESCRIPTION

Figure 1:
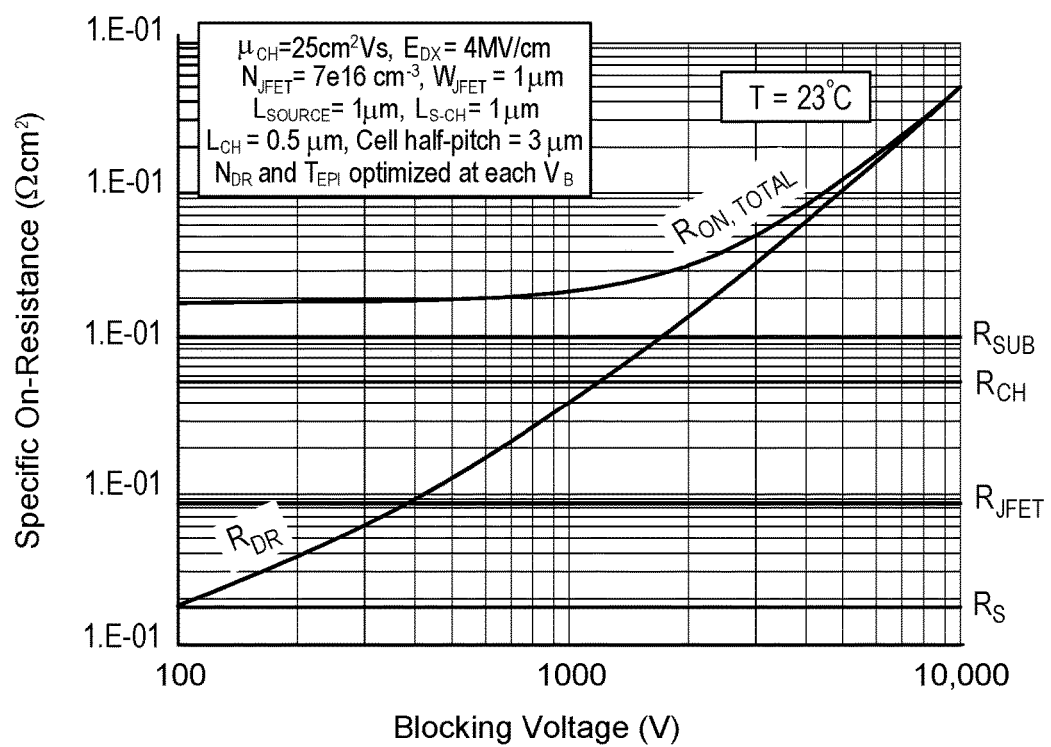
FIG. 1 is a graph showing the various components of the specific on-resistance $R_{ON,SP}$ of state-of-the-art SiC power DMOSFETs as a function of blocking voltage.

During investigations leading to the present invention, performance limit studies of various silicon carbide (SiC) semiconductor power switching devices such as Schottky diodes and MOS transistors (MOSFETs) suggested that the performance of such devices is limited by the electrical resistance of the SiC substrate on which they are fabricated, especially at blocking voltages below about 2,000 V. FIG. 1 provides a graph representing the internal resistance components of state-of-the-art SiC power DMOSFETs as a function of blocking voltage. The specific on-resistance (or resistance-area product) $R_{ON,SP}$ was found to be the most important measure of device performance, since the device cost scales as the square root of $R_{ON,SP}$. In other words, if $R_{ON,SP}$ can be reduced by a factor of four, the device cost may be reduced by a factor of two while delivering the same performance. FIG. 1 indicates that the substrate resistance $R_{SUB}$ is the dominant resistance component at blocking voltages below about 2,000 V.

SiC substrates are typically about 400 μm thick with a resistivity of about 18 to about 20 mΩcm. The specific substrate resistance $R_{SUB}$ is given by the product of thickness and resistivity. It is believed to not be possible to reduce the resistivity below about 18 to about 20 mΩ cm because of fundamental limitations of the material, so the only solution is to reduce the thickness of the substrate. When manufacturing DMOSFETs and similar devices, the substrate can be thinned as the last step in the fabrication process, but it is impractical to thin the substrate below about 100 to about 150 μm because of breakage during saw-apart and packaging. Consequently, there is a need for a way to reduce the substrate resistance below the value that can be achieved by thinning to about 100 to about 150 μm.

According to aspects of the present invention, SiC substrate resistance may be reduced without reducing the mechanical integrity of the substrate by etching pits or vias at least partially, and preferably most of the way, through the substrate in a regular pattern, and then filling the vias with ohmic metal and processing to form low-resistance ohmic contacts.

Figure 2:
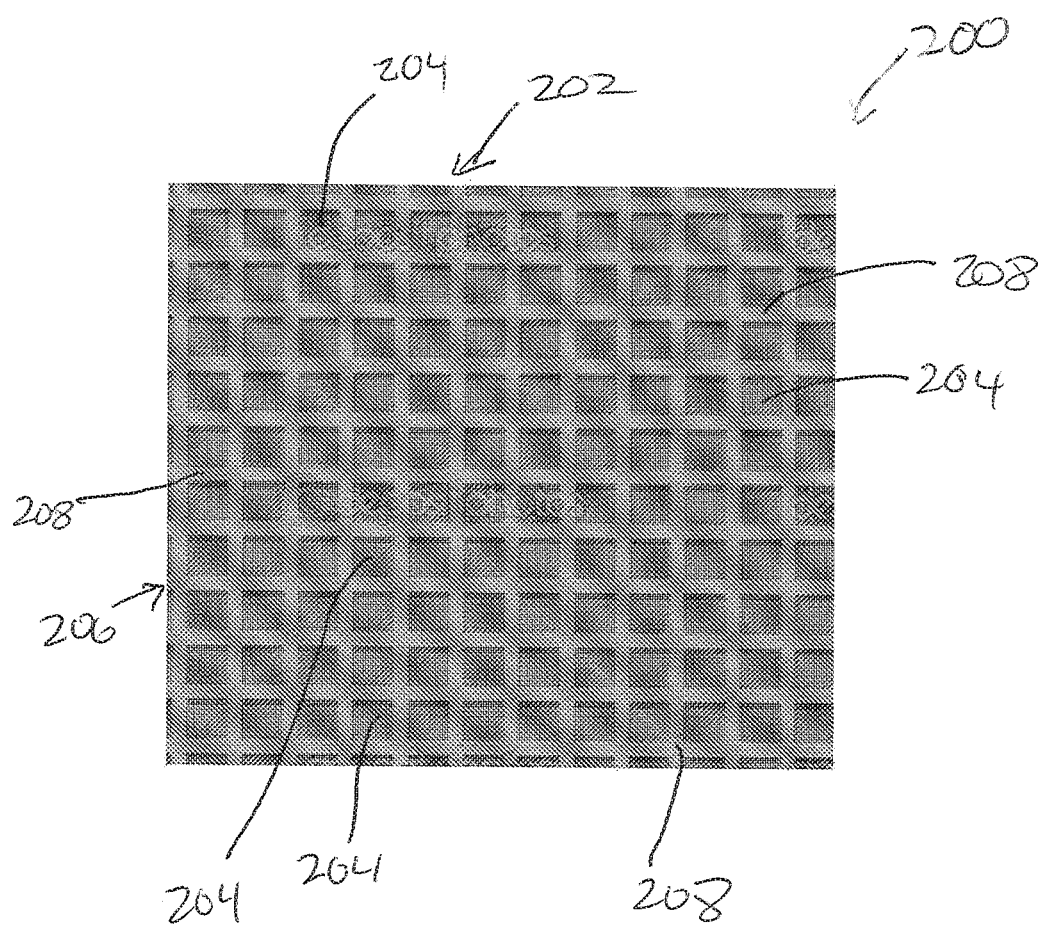
FIG. 2 illustrates a representational bottom plan view of a substrate that may be used in a power semiconductor device in accordance with at least one embodiment of the invention.

FIG. 2 shows a bottom plan view of an exemplary substrate 200 that may form part of a device that includes a region or layer in which a pattern 202 of pits or vias 204 are formed. Between adjacent pits is a grid 206 of unetched ridges 208 that provide mechanical strength while the intervening vias 204 provide low-resistance electrical paths that reduce the overall substrate resistance.

Suitable manufacturing processes would allow for about 100 to about 200 μm vias to be etched in SiC substrates using, for example, inductively-coupled plasma (ICP) reactive-ion etching (RIE) in $SF_6$ and $O_2$. Such processes would not only reduce the electrical resistance of the substrate, but the thermal resistance as well. SiC power devices dissipate significant heat during operation, with power densities of about 150 to about 250 W/cm² being fairly typical. This heat must be removed through the substrate to keep the surface temperature below about 150 to about 200° C. for long-term reliable operation of the devices. The temperature rise across the substrate is the product of the thermal resistivity times the thickness. Processes as described above reduce the effective thickness, thereby reducing both electrical and thermal resistance of the substrate.

Figure 3A:
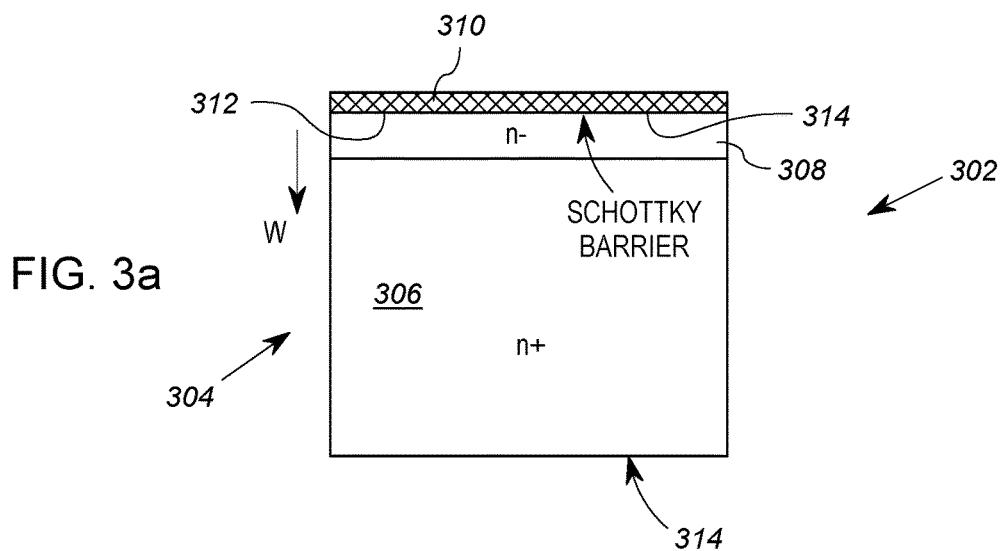
FIGS. 3a-3c illustrate a process of generating a Schottky diode in accordance with at least one embodiment of the invention.
Figure 3B:
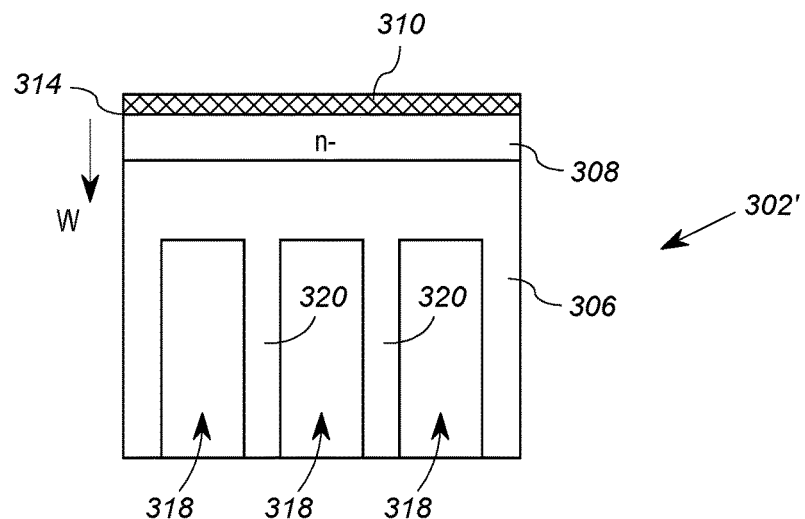
Figure 3C:
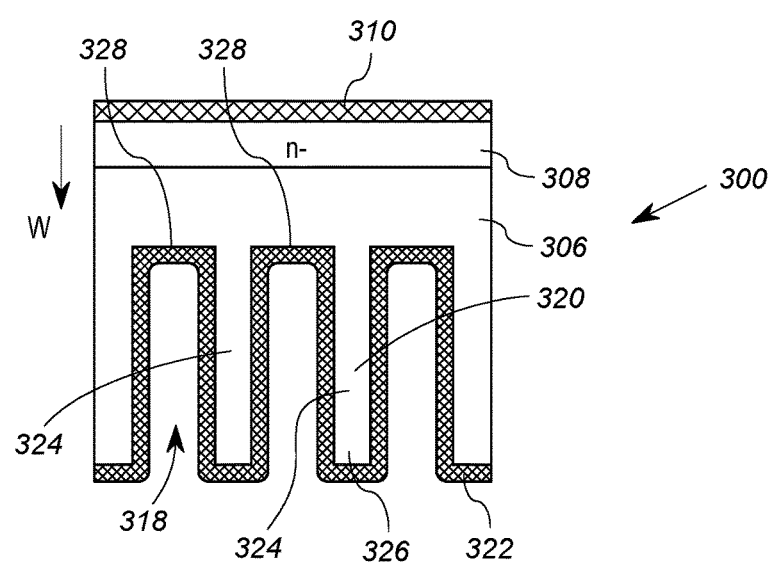

FIGS. 3a-3c illustrate an exemplary method of fabricating power semiconductor device in the form of a Schottky diode 300 that incorporates the pit structure of the invention. FIG. 3a illustrates a cutaway schematic view of an intermediate structure 302 during fabrication, FIG. 3b shows a cutaway schematic view of a further intermediate structure 302', and FIG. 3c shows a cutaway schematic view of the final structure of the exemplary Schottky diode 300.

Referring to FIG. 3a, the intermediate structure 302 has a silicon carbide wafer 304 having a silicon carbide substrate 306 and a first layer 308 formed on a first or upper surface 316 thereof. The substrate 306 has a first doping type, for example, n-type, at a first concentration, for example a highly doped n+ layer. The first layer 308 has the first doping type (e.g. n-type) at a second, lower, concentration, for example a low doped n− layer. A suitable barrier metal 310 is disposed on the first layer 308 on a first surface 312 of the silicon carbide wafer 304. The junction of the barrier metal 310 and the second layer 308 form a Schottky barrier 314.

In essence, the structure 302 of FIG. 3a includes all of the structures of a conventional silicon carbide Schottky diode except for the contact on the bottom or second surface 317. The fabrication of the intermediate structure 302 is well known and may be carried out in any suitable manner. Indeed, other variants of intermediate structures for Schottky devices including those in which a contact metal is disposed on the barrier metal 310 may be employed.

After fabrication of the intermediate structure 302, a pattern of pits is formed in the bottom surface 317 of the substrate 306 to a depth most of the way through the substrate 306. FIG. 3b shows the intermediate structure 302' which represents the intermediate structure 302 after the pattern of pits 318 is formed most of the way through the first layer 306. The pattern of pits 318 may suitably have the same pattern as the pattern 202 of FIG. 2. Similar to FIG. 2, ridges 320 separate adjacent pits 318. The pits 318 in this embodiment are formed by reactive ion etching ("RIE"). The pits 318 should extend at least 30% through the thickness of the substrate 306. While the pits 318 should preferably extend over 90% through the thickness of the first layer 306, for very thin devices (substrate layer 306 of 100-200 μm) the RIE process has a margin of error. To avoid extending the pits into the second layer 308, a buffer of approximately 30% of the width of the region/layer 306, which is the majority of the device 302', is provided. As processes improve, or if more accurate etching depths can be achieved, the pits 318 can extend further.

After forming the pattern of pits 318, ohmic metal is applied to the second surface 317. As shown in FIG. 3c, the final device 300 includes the ohmic metal contact layer 322 that covers the pits 318 and the ridges 320. The ohmic metal contact layer 322 may suitably be processed by laser annealing. In this exemplary embodiment, the ohmic metal contact layer 322 covers the walls 324 and tops 326 of the ridges 320, thereby forming an accessible contact on the tops 326 that is conductively connected to the innermost region 328 of the pits 318.

It will be appreciated, however, that it is not necessary that we have the ohmic contact 322 on walls 324 and tops 326 of the ridges 320, but rather only on the innermost region 328 of the pits 318. In such other embodiments, another highly-conductive connection would be formed between the ohmic contacts 322 and the tops of the ridges. This highly-conductive connection could be formed by a second deposition of a conductive material that is in contact with the ohmic metal 322 at the innermost region 328 of the pits 318. This second material might be a metal, a conductive epoxy, or any suitable material having high electrical and thermal conductivity.

As a consequence, the electrically functional thickness of the device 300 is defined from the top of the barrier metal 310 to the innermost regions 328 of the pits 318. This provides for a relatively thin active device, while the walls 324 of the ridges 320 provide a mechanical strength of a much thicker device.

Figure 4A:
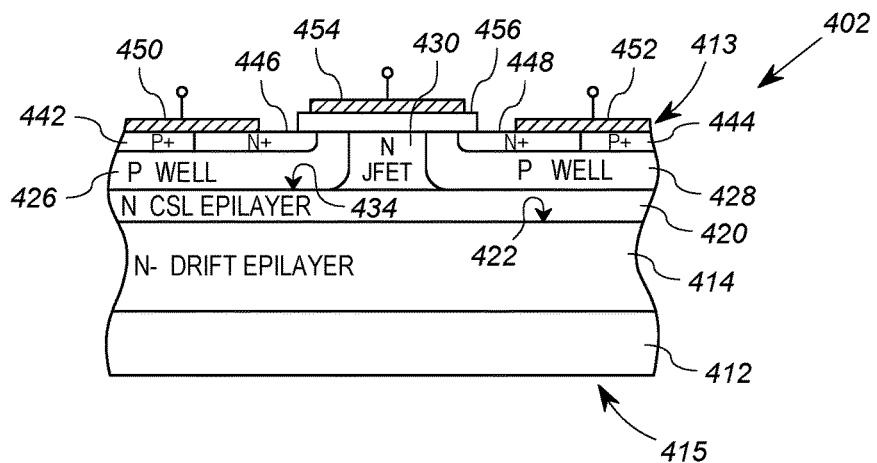
FIGS. 4a-4c illustrate a process of generating a D-MOSFET device in accordance with at least one embodiment of the invention.
Figure 4B:
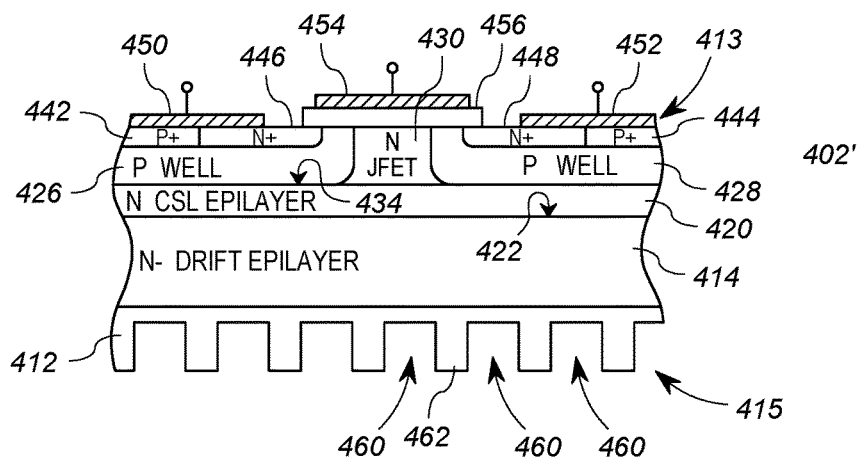
Figure 4C:
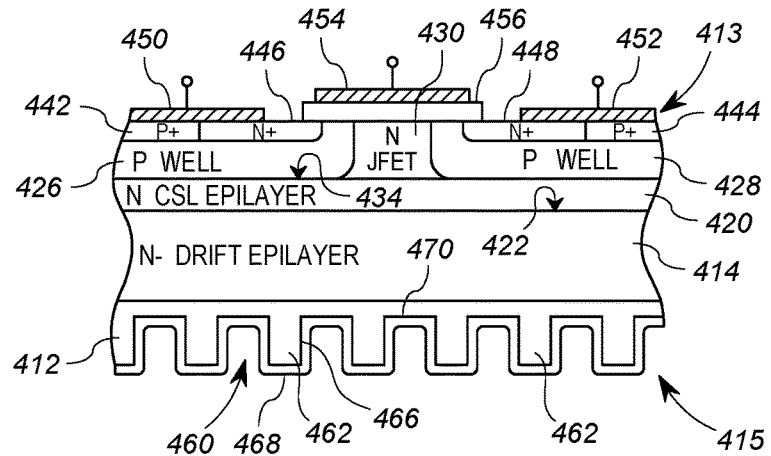

FIGS. 4a-4c show an exemplary method of fabricating a power semiconductor device in the form of a D-MOSFET 400 that incorporates the pit structure of the invention. FIG. 4a illustrates a cutaway schematic view of an intermediate structure 402 during fabrication, FIG. 4b shows a cutaway schematic view of another intermediate structure 402', and FIG. 4c shows a cutaway schematic view of the final structure of the exemplary D-MOSFET 400.

Referring to FIG. 4a, the intermediate structure 402 has a silicon carbide substrate 412 and a first region or layer 414. The silicon carbide substrate region 412 has a first doping concentration of a first doping type, for example, an n+ doping. The first layer comprises a drift layer 414 formed above a top surface 417 of the substrate region 412 and having a lighter doping concentration of the first doping type, for example, an n− doping. The intermediate structure 402 also includes at least one source region 446, 448, at least one base region 426, 428, a dielectric region 456, and a gate contact 454.

The layout and fabrication of the intermediate structure 402 is substantially the same as the DMOSFET device shown in FIG. 1 of U.S. Patent Publication No. 2006/0192256, which is incorporated herein by reference. However, it will be appreciated that corresponding elements of other DMOSFET devices may be employed.

The at least one source region 446, 448 has the first doping type, and is preferably heavily doped. In the embodiment described herein where the first doping type is n-type, the two source regions 446, 448 include n+ doped regions formed near the first surface 413, above the drift layer 414. The two source regions 446, 448 are spaced apart laterally.

Each of the base regions 426, 428 has the second doping type and is disposed between a corresponding one of the source regions 446, 448 and the drift layer 414. The base regions 426, 428 in this embodiment are p+ regions, sometimes referred to as p-wells. As is known in the art, the base region 426 is disposed under the source region 446 and also has a portion that extends to the first surface 413 in the space between the source regions 446, 448. Likewise, the base region 428 is disposed under the source region 448 and also has a portion extends to the first surface 413 in the space between the source regions 446, 448.

The dielectric region 456 is formed above the drift layer; and extends laterally at least over the portions of the base regions/p-wells 426, 428 that extend to the first surface 413. The gate contact 454 is a conductive layer or structure formed above dielectric region 456 and above at least a portion of the base regions 426, 428. As is known in the art, the gate contact 454 may also extend laterally at least slightly over each of the source regions 446, 448.

In accordance with the exemplary embodiment described herein the intermediate structure 402 (and final device 400) also includes a current spreading layer 420 having a doping of the first type (e.g. n-type) having a concentration that is greater than the doping concentration of the drift layer 414 and less than the doping concentration than the substrate layer 412 and the source regions 446, 448. The current spreading layer 420 is disposed immediately above the drift layer 414 and below (and abutting) the base regions 426 and 428. The structure 402 also includes a JFET region 430 between the base regions (p-wells) 426, 428 and underneath the gate contact 454. The JFET region 430 has the first doping type. The details of the structure and operation of the current spreading layer 420 and JFET region 430 are described in U.S. Patent Publication No. 2006/0192256. It will be appreciated, however, that other DMOSFET structures would not require such a current spreading layer 420.

In essence, the structure 402 can have all of the structures of a vertical silicon carbide DMOSFET except for the contact on the second surface 415. The fabrication of the intermediate structure 402 is well known and may be carried out as described in U.S. Patent Publication No. 2006/0192256 After fabrication of the intermediate structure 402, a pattern of pits is formed in the second surface 415 to a depth most of the way through the first layer 412. FIG. 4b shows the intermediate structure 402' which represents the intermediate structure 402 after the pattern of pits 460 is formed most of the way through the first layer 412. The pattern of pits 460 may suitably have the same pattern as the pattern 202 of FIG. 2. Similar to FIG. 2, walls or ridges 462 separate adjacent pits 460. The pits 460 in this embodiment may suitably be formed by reactive ion etching ("RIE"), similar to the method described above in connection with FIG. 2. The pits 460 should extend at least 30% through the thickness of the first layer 412.

After forming the pattern of pits 460, the ohmic metal is applied to the second surface 415 with the pits 460. As shown in FIG. 4c, the final device 400 includes the ohmic metal contact layer 464 that covers the pits 460 and the ridges 462. The ohmic metal contact layer 464 is processed by laser annealing methods. The ohmic metal contact layer 464 in this embodiment covers the walls 466 and tops 468 of the ridges 462, thereby forming an accessible contact on the tops 468 that is conductively connected to the innermost region 470 of the pits 460. However, as discussed above, in other embodiments, the metal contact layer 464 may only cover the innermost region 470 of the pits 460 (and in some cases the tops 468 as well). Another conductive material may be applied in the pits 460 as discussed above.

As a consequence, the electrically functional thickness of the device 400 is defined from the gate contact 454 to the innermost regions 470 of the pits 460. This provides for a very thin active portion of the device, while the walls 466 of the ridges 462 provide a mechanical strength of a much thicker device. It will further be appreciated that the advantages of the pits 460 and metal contact layer 464 may be realized in D-MOSFETs having different structures, such as those that do not necessarily include a current spreading layer 420, or those that include additional elements.

Figure 5A:
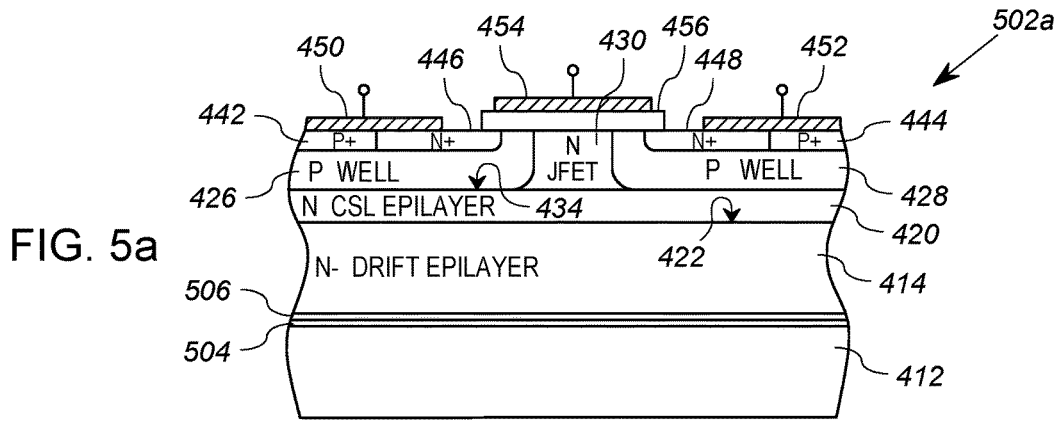
FIGS. 5a-5e illustrate an alternative process of generating a D-MOSFET device in accordance with at least one embodiment of the invention.

In an alternative embodiment, the D-MOSFET similar to that of FIG. 4c may be developed using a substrate that includes buried etch stop layers to allow the pits to extend substantially all of the way through the substrate layer 412. In particular, FIG. 5a shows an intermediate structure 502a which has the same elements as the intermediate structure 402 of FIG. 4a, but which also includes a buried etch stop layer 504 of the second doping type, for example a p+ doped etch stop layer. The etch stop layer 504 may suitably be 1 or 2 μm and is disposed immediately above and adjacent to the substrate layer 412. The intermediate structure 502a further includes a second etch stop layer 506 which is over the first doping type, and preferably at a doping concentration that is higher than that of the drift layer 414. The second etch stop layer 506 may suitable be an n+ type layer in the example described herein. The second etch stop layer 506 may also suitably be 1 or 2 μm.

Figure 5B:
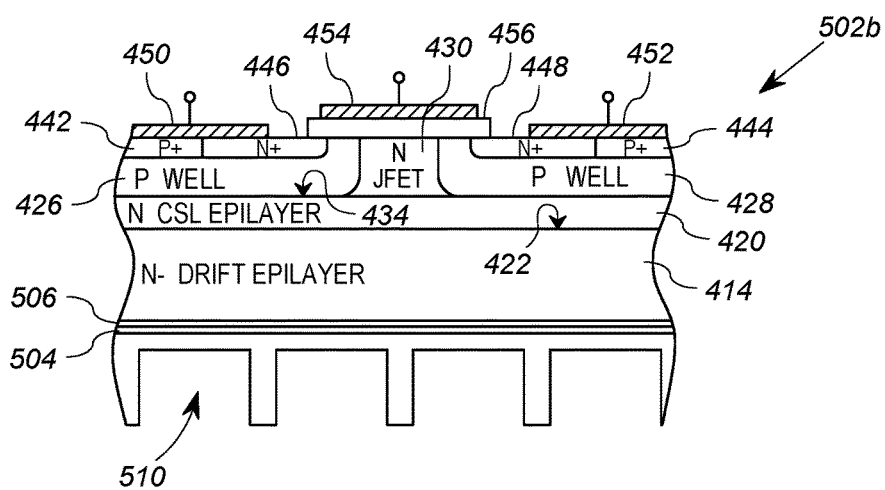
Figure 5C:
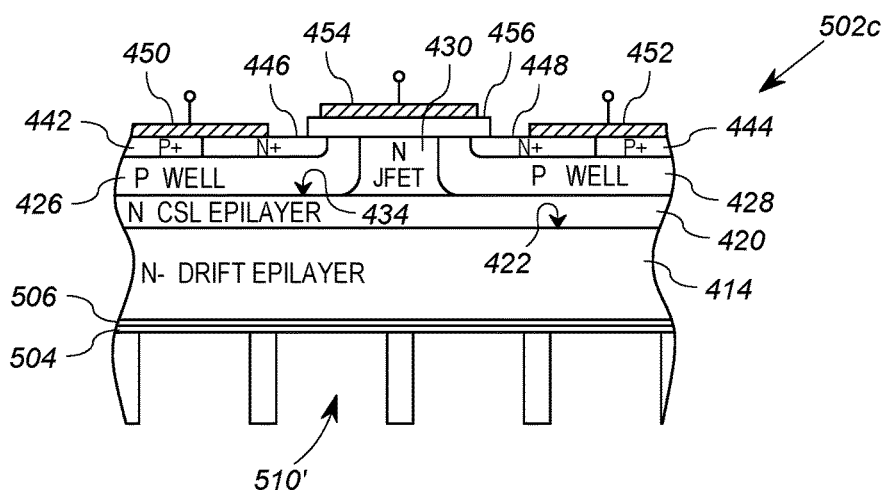
Figure 5D:
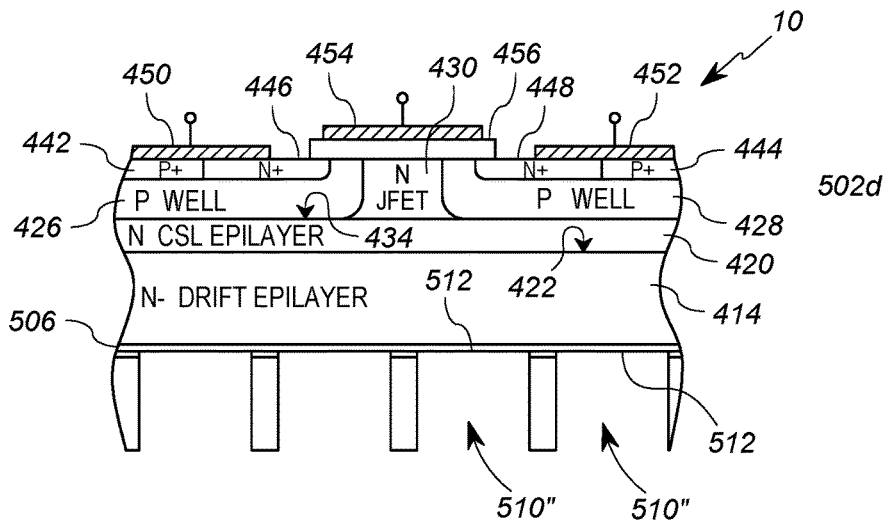

To prepare the pits in the embodiment of FIGS. 5a-5e, the pits are etched most of the way through the substrate layer 412 using RIE, similar to that used in the embodiments of FIGS. 2, 3 and 4a-4c. FIG. 5b shows an intermediate structure 502b having the pits 510 etched partially through, similar to those shown in FIG. 4b. After the RIE step, the remainder of the substrate layer 414 in the pits 510 is etched using photo-electrochemical etching through to the p+ etch stop layer 504. The result of this step is the intermediate structure 502c shown in FIG. 5c. The pits 510' extend all of the way to the p+ etch stop layer 504.

Figure 5E:
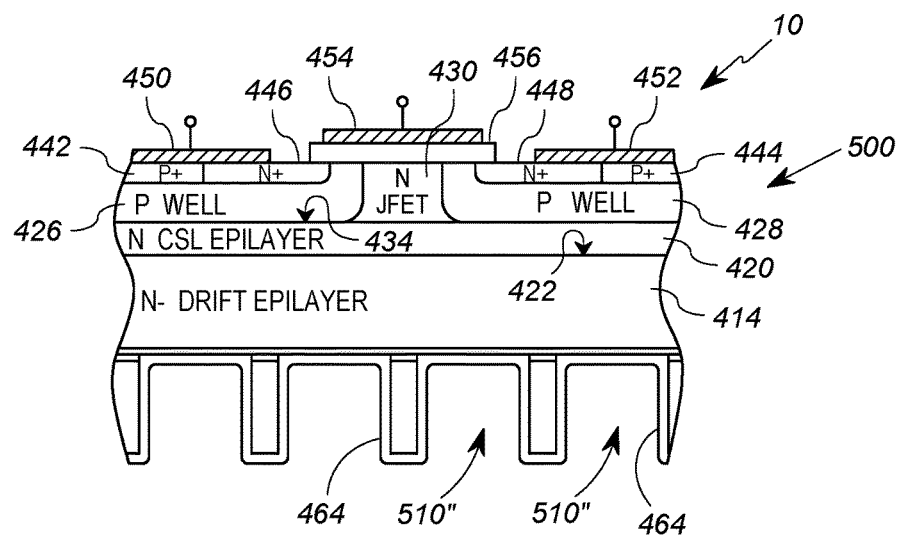

Thereafter, the p+ etch stop layer 504 at the innermost part 512 of the pits 510' is etched away using electrochemical etching processes. The result of this step is that the pits 510" extend all the way to the second etch stop layer 506. The result is the intermediate device 502d shown in FIG. 5d. Thereafter, the contact metal layer 464 is applied (e.g. by laser annealing) as described above, producing a final structure 500 as shown in FIG. 5e. In this embodiment, it can be seen that the pits 510" extend almost all of the way through the substrate layer 412. This provides an even more favorable on-resistance characteristic and eliminates processing variations due to non-uniformity in the thickness of the original substrate 412 and/or poor control of the RIE step that forms the structure of FIG. 5b.

In view of the above, it can be seen that a significant advantage of this invention is that resistance of SiC substrates may be reduced below the value that can be achieved by conventional thinning techniques, resulting in more efficient and lower cost SiC substrate-based devices. Although the invention has been described in terms of SiC substrates, it is foreseeable that aspects of the present invention may be similarly applicable to substrates formed of other materials.

Figure 6:
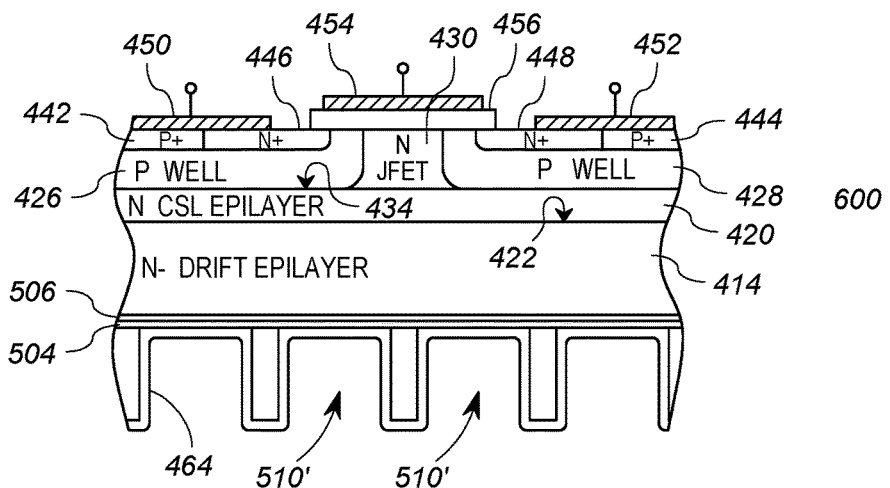
FIG. 6 illustrates an exemplary IGBT device in accordance with at least one embodiment of the invention.

In yet another embodiment, an insulated gate bipolar transistor (IGBT) having the pitted silicon carbide substrate can be realized in a variant of the process of FIGS. 5a-5e. In particular, instead of etching the p+ etch stop layer 504, the metal contact 464 is formed over the pits 510' of FIG. 5c, including portions of the p+ etch stop layer 504 exposed within the pits 510'. The etch stop layer 504 in this embodiment forms a buffer layer of the IGBT. Such a process produces the final IGBT structure 600 shown in FIG. 6.

While the invention has been described in terms of specific embodiments, it is apparent that other forms could be adopted by one skilled in the art. For example, the etched pattern on the substrate could differ in appearance and construction from the embodiment shown in the Figures, and appropriate materials could be substituted for those noted. Moreover, it will be appreciated that the device fabrications methods illustrated in FIGS. 3a-3c, 4a-4c, and 5a-5e, the formation of the pits need not occur after the other parts of the device are completed. For example, the pits 318 may be formed in the substrate 306 of FIG. 3a before one or more of the layer 308 or barrier metal layer 310. In another example, the pits 460 of FIG. 4b may be formed at various times before the completion of the intermediate structure 402 shown in FIG. 4a. Moreover, the ohmic contacts in the various embodiments need not be formed immediately after the formation of the pits. For example, it is possible that some of the elements of the structure 402 of FIG. 4a are generated after formation of the pits 460, but before the formation of the ohmic metal layer 464.

Accordingly, it should be understood that the invention is not limited to the specific embodiments illustrated in the Figures. It should also be understood that the phraseology and terminology employed above are for the purpose of disclosing the illustrated embodiments, and do not necessarily serve as limitations to the scope of the invention. Finally, while the appended claims recite certain aspects believed to be associated with the invention, they do not necessarily serve as limitations to the scope of the invention.

The invention claimed is:

1. A method of forming at least a part of a power semiconductor device, the method comprising:
   a) forming at least one layer on a first side of silicon carbide substrate;
   b) forming a pattern of pits on a second side of the silicon carbide substrate;
   c) locating an ohmic metal at least within the pits to define low-resistance ohmic contacts; and
   wherein the power semiconductor device includes at least a substrate region including the pattern of pits and a first layer disposed between the substrate region and an ohmic contact, wherein the substrate region has a first doping concentration of a first doping type and the first layer has a second doping concentration of the first doping type, the second doping concentration less than the first doping concentration.

2. The method of claim 1, wherein step b) further comprises:
   b1) forming a least a portion of the pits using reactive ion etching.

3. The method of claim 2, wherein substep b1) comprises forming the pits to have a depth of at least 30% of the substrate region thickness.

4. The method of claim 2, wherein substep b1) further comprises using reactive ion etching followed by photoelectrochemical etching to etch to an etch stop layer disposed between the substrate region and the second region, the etch stop layer having a second doping type.

5. The method of claim 4, further comprising, after substep b1):
   b2) etching the etch stop layer using a different etching process.

6. The method of claim 5, wherein the different etching process is electrochemical etching.

7. The method of claim 6, wherein step c) further comprises forming the ohmic contacts using laser annealing.

8. The method of claim 2, wherein step c) further comprises forming the ohmic contacts using laser annealing.

9. The method of claim 1, wherein step c) further comprises forming the ohmic contacts using laser annealing.

* * * * *